(12) United States Patent
Takida

(10) Patent No.: US 10,903,744 B2
(45) Date of Patent: Jan. 26, 2021

(54) SIGNAL GENERATION CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takayuki Takida, Edogawa Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/575,738

(22) Filed: Sep. 19, 2019

(65) Prior Publication Data

US 2020/0161970 A1    May 21, 2020

(30) Foreign Application Priority Data

Nov. 16, 2018  (JP) ................................. 2018-215674

(51) Int. Cl.
*H02M 3/156*   (2006.01)
*H02M 1/32*    (2007.01)
*H03F 3/217*   (2006.01)

(52) U.S. Cl.
CPC ............. *H02M 3/156* (2013.01); *H02M 1/32* (2013.01); *H03F 3/217* (2013.01)

(58) Field of Classification Search
None
See application file for complete search history.

(56) References Cited

U.S. PATENT DOCUMENTS

| 7,105,947 B1* | 9/2006 | Marshall ................ H02J 1/102 307/28 |
| 7,142,048 B2 | 11/2006 | Miyagaki et al. |
| 7,332,831 B2* | 2/2008 | Miyagoe ................ H02M 1/36 307/18 |

(Continued)

FOREIGN PATENT DOCUMENTS

| JP | 2003110441 A | 4/2003 |
| JP | 2004214712 A | 7/2004 |
| JP | 6150865 B2 | 10/2015 |

*Primary Examiner* — Kenneth B Wells
(74) *Attorney, Agent, or Firm* — Holtz, Holtz & Volek PC

(57) ABSTRACT

A signal generation circuit of an embodiment is a signal generation circuit giving a generated signal corresponding to an input signal to an amplification circuit configured to generate an output within a range based on a power supply voltage, the signal generation circuit including: a first voltage generating portion configured to generate an internal midpoint potential based on the power supply voltage; a second voltage generating portion configured to generate a starting voltage of the generated signal based on the power supply voltage and the amplification circuit; a resistance circuit configured to output a voltage caused to attenuate or pass through on the basis of the internal midpoint potential; a controlling portion configured to change a resistance value of the resistance circuit; and an output circuit configured to output the output voltage of the resistance circuit as the generated signal.

20 Claims, 4 Drawing Sheets

(56) References Cited

U.S. PATENT DOCUMENTS

| | | | | |
|---|---|---|---|---|
| 7,760,016 B2* | 7/2010 | Kanji | ............ | H03F 1/305 |
| | | | | 330/51 |
| 7,777,562 B2* | 8/2010 | Wei | ............ | H03F 3/2173 |
| | | | | 330/10 |
| 8,022,756 B2* | 9/2011 | Walker | ............ | H03F 3/217 |
| | | | | 330/10 |
| 8,093,951 B1* | 1/2012 | Zhang | ............ | H03F 3/217 |
| | | | | 330/251 |
| 8,472,643 B2* | 6/2013 | Chen | ............ | H03F 3/68 |
| | | | | 381/120 |
| 8,649,532 B2* | 2/2014 | Adachi | ............ | H03F 3/45475 |
| | | | | 381/104 |
| 9,036,836 B2 | 5/2015 | Zhang et al. | | |
| 9,257,945 B2 | 2/2016 | Zhang et al. | | |
| 10,396,742 B2* | 8/2019 | Shiozawa | ............ | H03G 3/3005 |

* cited by examiner

SIGNAL GENERATION CIRCUIT

CROSS REFERENCE TO RELATED APPLICATION

This application is based upon and claims the benefit of priority from the prior Japanese Patent Application No. 2018-215674 filed in Japan on Nov. 16, 2018; the entire contents of which are incorporated herein by reference.

FIELD

Embodiments described herein relate generally to a signal generation circuit.

BACKGROUND

Recently, Class-D amplifiers adopting a PWM modulator have become widely used as on-board audio amplifiers. The PWM modulator performs pulse-width modulation of an audio signal by comparing the audio signal with a sawtooth wave (one-edge) or a triangular wave (both-edge) carrier. The PWM modulator obtains a PWM pulse which is a binary switching waveform as a result of the pulse width modulation. The Class-D amplifier (hereinafter also referred to as a CDA) performs power amplification by driving an output transistor (a switching transistor) by the PWM pulse. A power-amplified switching output is demodulated using a low-pass filter to drive a speaker.

In the case of using the CDA for an audio signal amplification circuit, there may be a case where, for design reasons, a CDA with fixed gain is adopted, and an attenuator is arranged at a previous stage of the CDA to cause a level of audio output to be variable. The attenuator is also used for adjustment of attenuation for sound muting (blocking) or for fade-in/fade-out.

In order to cause a low-pass filter output to be a midpoint potential corresponding to ½ of a power supply voltage in a CDA using a single power supply, a bias voltage generation circuit for applying a bias voltage to the CDA at startup is adopted at a previous stage of the CDA. The bias voltage generation circuit applies a ramp voltage that causes a voltage to gradually rise immediately after startup, as the bias voltage in order to suppress pop noise from a speaker connected to the low-pass filter on an output end of the CDA. Therefore, at startup, a startup time period until the ramp voltage reaches a predetermined voltage is required. Especially, in an on-board amplification circuit, since fluctuation of the power supply voltage supplied from a battery is relatively large, there is a problem that a long time period is required for startup.

Further, there is also a problem that, when the CDA is connected to a digital/analog conversion circuit, output noise increases while there is no signal input and during mute.

DETAILED DESCRIPTION

A signal generation circuit of an embodiment is a signal generation circuit giving a generated signal corresponding to an input signal to an amplification circuit configured to generate an output within a range based on a power supply voltage, the signal generation circuit including: a first voltage generating portion configured to generate an internal midpoint potential based on the power supply voltage; a second voltage generating portion configured to generate a starting voltage of the generated signal based on the power supply voltage and gain of the amplification circuit; a resistance circuit configured with a variable resistance element and configured to, when the input signal and the internal midpoint potential, or the internal midpoint potential and the starting voltage are inputted, output a voltage caused to attenuate or pass through on the basis of the internal midpoint potential; a controlling portion configured to output a control signal to change a resistance value of the resistance circuit; and an output circuit configured to output the output voltage of the resistance circuit as the generated signal.

Embodiments of the present invention will be described in detail below with reference to drawings.

First Embodiment

Figure 1:
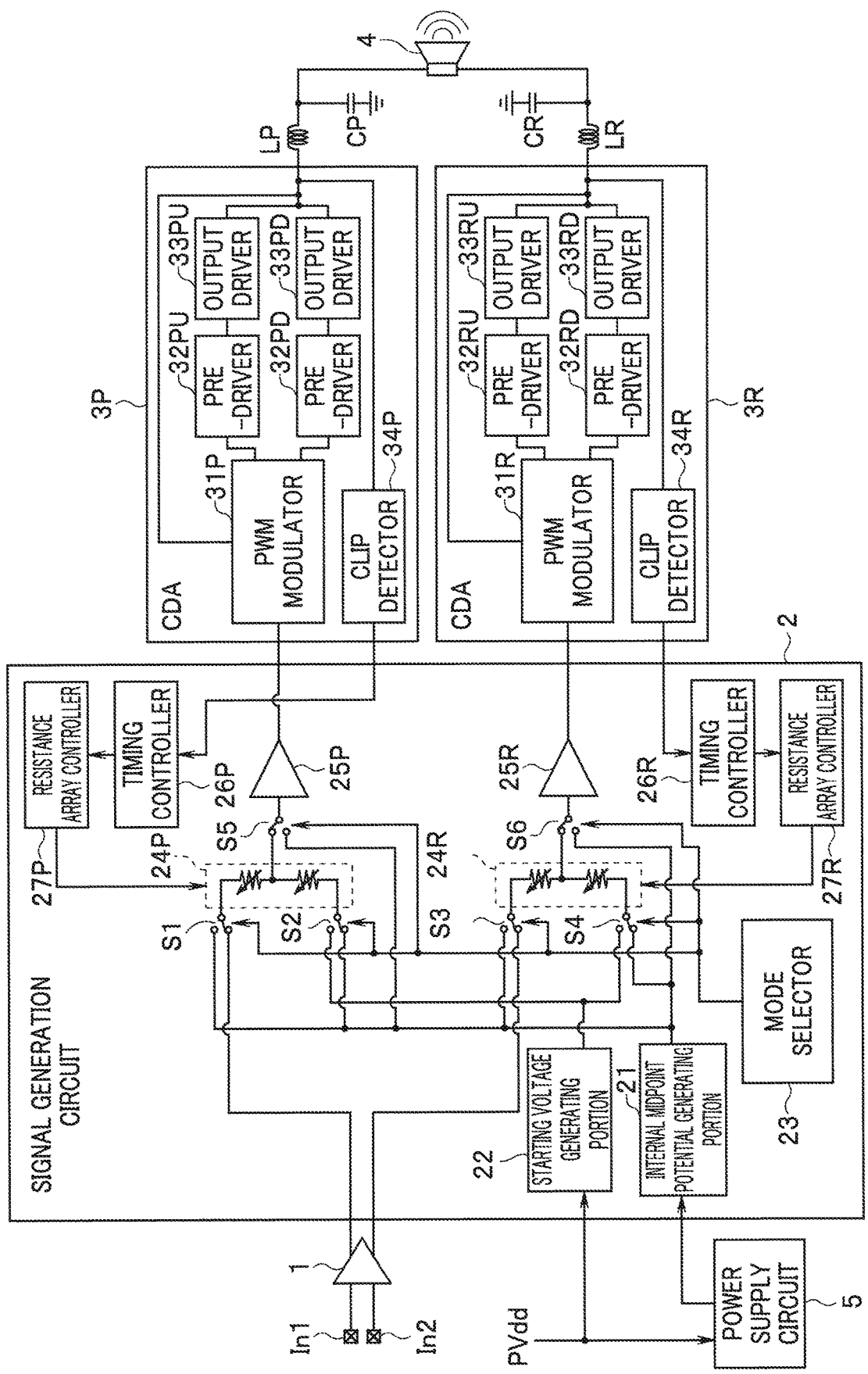
FIG. 1 is a circuit diagram showing an amplification circuit using a signal generation circuit according to a first embodiment of the present invention.

FIG. 1 is a circuit diagram showing an amplification circuit using a signal generation circuit according to a first embodiment. Note that though FIG. 1 shows a configuration in a case where paired CDAs are BTL (balanced transformer less) connected, the present embodiment is similarly applicable to a single-end connection circuit.

The present embodiment makes it possible to shorten a startup time period of an amplification circuit by changing an initial value (a starting voltage) of a ramp voltage according to fluctuation of a power supply voltage PVdd.

First, the startup time period of an amplification circuit using single power supply will be described.

In general, a digital audio signal to be amplified is supplied to the CDAs with predetermined gain via attenuators after being converted to an analog signal by a D/A converter. A bias voltage generation circuit configured to apply a ramp voltage at startup is connected to the CDAs. In an on-board audio amplification circuit, PWM outputs from output transistors of the CDAs change between 0 V and PVdd due to a power supply voltage PVdd from a battery. To the D/A converter, the attenuators and the bias voltage generation circuit at previous stages of the CDAs, an internal power supply voltage AVdd, for example, of 5 V generated based on the power supply voltage PVdd is supplied.

The PWM outputs are supplied to a speaker via low-pass filters (hereinafter referred to as LC-LPFs), each of which is configured with a coil L and a capacitor C. The bias voltage generation circuit sets the level of LC-LPF outputs after demodulation to a midpoint potential of the power supply voltage PVdd (hereinafter referred to as an output midpoint potential) for DC by adding a bias voltage to the inputted audio signal. In other words, the bias voltage generation circuit generates a ramp voltage that causes input voltages of the CDAs to rise up to a midpoint potential of the internal power supply voltage AVdd (hereinafter referred to as an internal midpoint potential) at startup.

Note that, during normal operation of the amplification circuit, inputs of the CDAs become signals fluctuating around the internal midpoint potential, and LC-LPF outputs become signals fluctuating around the output midpoint potential. Therefore, each of the inputs of the CDAs will be described as an AC signal that is negative from 0 V up to the internal midpoint potential and is positive from the internal midpoint potential up to the internal power supply voltage. Each of the LC-LPF outputs will be described as an AC signal that is negative from 0 V up to the output midpoint potential and is positive from the output midpoint potential up to the power supply voltage.

In a case where the paired CDAs are BTL-connected and given differential inputs at the same level, the LC-LPF output of one CDA is higher than the LC-LPF output of the other CDA due to DC offset of operational amplifiers of the CDAs, and imbalance in circuit constants of the LC-LPFs and the like, and pop noise may occur. If the ramp voltage Sharply rises, the level of the LC-LPF output of one CDA is significantly higher than the other, and there is a possibility that extremely high-level pop noise occurs. Therefore, in general, occurrence of the pop noise is suppressed by causing a rise slope of the ramp voltage to be gentle to cause rise slopes of the LC-LPF outputs to be gentle. Therefore, a time period required until the bias voltage reaches the internal midpoint potential lengthens, and a startup time period required until the CDAs normally operate lengthens.

In a 0-V state in which the bias voltage has the maximum negative amplitude, the CDAs with predetermined gain generally get into an over-modulation state; and the LC-LPF outputs are clipped and become 0 V. When the bias voltage rises, becomes higher than 0 V and reaches a predetermined value, the LC-LPF outputs get out of the clipped state and become levels corresponding to inputs. The LC-LPF outputs do not change from 0 V during a period during which the LC-LPF outputs are clipped. Therefore, the period does not contribute to a period during which pop noise is suppressed by causing the rise slopes of the LC-LPF outputs to be gentle, and the startup time period lengthens. Therefore, it is conceivable to, by setting the ramp voltage immediately after startup (hereinafter referred to as a starting voltage) not to 0 V but to a predetermined level, shorten the clipped period and shorten the startup time period.

However, since the power supply voltage PVdd is acquired from the battery in the on-board audio amplification circuit, the power supply voltage PVdd significantly changes according to a use state of the battery. For example, in the case of a 12-V battery, a voltage of about 18 V at the maximum may be generated. When the starting voltage is set to a level at which the LC-LPF outputs are not clipped, a differential voltage at a predetermined level is inputted to the pair of CDAs immediately after startup, and pop noise occurs. The starting voltage is required to be set so that the LC-LPF outputs are certainly clipped, and is set to a sufficiently low voltage value in consideration of the maximum value of the power supply voltage. Therefore, a clip period lengthens according to the use state, and there is a problem that the startup time period cannot be shortened.

Therefore, in the present embodiment, the clip period is shortened to shorten the startup time period by changing the starting voltage according to the value of the power supply voltage PVdd.

An audio signal amplification circuit in FIG. 1 is configured with a signal generation circuit 2, CDAs 3P and 3R, and a power supply circuit 5. An amplifier 1 amplifies a differential audio signal inputted to input terminals In1 and In2 and outputs the differential audio signal to the signal generation circuit 2. To the power supply circuit 5, a power supply voltage PVdd is supplied from a battery not shown. The power supply circuit 5 generates an internal power supply voltage AVdd with a predetermined value from the power supply voltage PVdd and outputs the internal power supply voltage AVdd to an internal midpoint potential generating portion 21. The internal midpoint potential generating portion 21 generates a voltage corresponding to ½ of the internal power supply voltage AVdd as an internal midpoint potential VCOMMON. A starting voltage generating portion 22 generates a starting voltage set based on the power supply voltage PVdd and gains of the CDAs 3P and 3R.

The CDA 3P and the CDA 3R have the same configuration. The CDAs 3P and 3R are circuits configured to convert a normal-phase signal and an anti-phase signal (hereinafter, the signals may be referred to as generated signals), which are outputs of the signal generation circuit 2, to signals within a range based on a power supply voltage, and output the signals. Each of PWM modulators 31P and 31R is generally configured with an integrator and a comparator, and outputs a PWM pulse with a duty ratio corresponding to levels of a generated signal and a feedback signal of an output PWM, by a comparison signal such as a triangular wave and saw tooth wave. Each of a normal-phase PWM pulse from the PWM modulator 31P and an anti-phase PWM pulse from the PWM modulator 31R is branched to a high side and a low side, respectively, and power-amplified. A pre-driver 32PU drives an output driver 33PU by the normal-phase high-side PWM pulse from the PWM modulator 31P. A pre-driver 32PD drives an output driver 33PD by the normal-phase low-side PWM pulse from the PWM modulator 31P. Further, a pre-driver 32RU drives an output driver 33RU by the anti-phase high-side PWM pulse from the PWM modulator 31R. A pre-driver 32RD drives an output driver 33RD by the anti-phase low-side PWM pulse from the PWM modulator 31R. Though only an AD mode is shown as an operation mode of the Class-D amplifier, other modes such as a BD mode are also applicable. Further, though each of the PWM modulators 31P and 31R is configured with a single-ended amplifier, a fully differential amplifier configuration is also applicable to the integrator and the like.

The power supply voltage PVdd is supplied to the output driver 33PU, and the output driver 33PD is connected to a reference potential point. The normal-phase PWM pulse is power-amplified by the output drivers 33PU and 33PD. A normal-phase PWM output changing between 0 V and PVdd appears at each of output ends of the output drivers 33PU and 33PD. The power supply voltage PVdd is supplied to the output driver 33RU, and the output driver 33RD is connected to the reference potential point. The anti-phase PWM pulse is power-amplified by the output drivers 33RU and 33RD. An anti-phase PWM output changing between 0 V and PVdd appears at each of output ends of the output drivers 33RU and 33RD.

Each of output ends of the output drivers 33PU and 33PD is connected to the reference potential point via a coil LP and a capacitor CP constituting an LC-LPF. Each of output ends of the output drivers 33RU and 33RD is connected to the reference potential point via a coil LR and a capacitor CR constituting an LC-LPF. Carrier components are removed from the PWM outputs that appear at the output ends, by the LC-LPFs, and an outputted audio signal is restored.

Between a connection point between the coil LP and the capacitor CP (a normal-phase output end of the CDA 3P)

and a connection point between the coil LR and the capacitor CR (an anti-phase output end of the CDA 3R), a speaker 4, which is a load, is connected. Note that the outputs appearing at the output ends of the CDAs 3P and 3R are referred to as LC-LPF outputs. The speaker 4 outputs a sound based on the LC-LPF outputs.

The signal generation circuit 2 generates the normal-phase and anti-phase signals supplied to the CDAs 3P and 3R. A normal-phase audio signal inputted to the input terminal In1 is supplied to a resistance array 24P via a switch S1 after being amplified by the amplifier 1, and is attenuated by the resistance array 24P constituting an attenuator. An output of the resistance array 24P is supplied to the PWM modulator 31P via a switch S5 and a buffer amplifier 25P. An anti-phase audio signal inputted to the input terminal In2 is supplied to a resistance array 24R via a switch S3 after being amplified by the amplifier 1, and is attenuated by the resistance array 24R constituting an attenuator. An output of the resistance array 24R is supplied to the PWM modulator 31R via a switch S6 and a buffer amplifier 25R. Here, each of the attenuators configured with the resistance arrays 24P and 24R and the buffer amplifiers 25P and 25R may have a circuit configuration of an integrator or a fully differential amplifier.

As for the resistance array 24P, an output of the switch S1 is given to one end, and an output of the internal midpoint potential generating portion 21 or the starting voltage generating portion 22 is selectively supplied to the other end by a switch S2. As for the resistance array 24R, an output of the switch S3 is given to one end, and an output of the internal midpoint potential generating portion 21 or the starting voltage generating portion 22 is selectively supplied to the other end by a switch S4.

In the present embodiment, each of the resistance arrays 24P and 24R, which are resistance circuits, not only functions as an attenuator to cause a signal to attenuate by a set amount of attenuation but also functions as a part of a bias generation circuit configured to generate a ramp voltage to cause a signal to increase by a set amount of increase. A mode selector 23 sets an attenuator operation mode for causing the resistance arrays 24P and 24R to function as attenuators, and a ramp voltage generation mode for causing the resistance arrays 24P and 24R to function as a part of the bias generation circuit.

During the attenuator operation mode, the mode selector 23 causes the switches S1 and S3 to select an inputted audio signal and causes the switches S2 and S4 to select an output of the internal midpoint potential generating portion 21. Therefore, in this case, normal-phase and anti-phase signals fluctuating on the basis of the internal midpoint potential VCOMMON and attenuating based on the resistance arrays 24P and 24R are outputted.

During the ramp voltage generation mode, the mode selector 23 causes the switches S1 and S3 to select an output of the internal midpoint potential generating portion 21 and causes the switches S2 and S4 to select an output of the starting voltage generating portion 22. Therefore, in this case, a ramp voltage with a voltage value between the starting voltage and the internal midpoint potential VCOMMON, which is based on the resistance arrays 24P and 24R, is outputted.

Note that the resistance array 24P can be configured, for example, by connecting a variable resistance ladder between the switches S1 and S2. Similarly, the resistance array 24R can be configured, for example, by connecting a variable resistance ladder in series between the switches S3 and S4. By controlling respective control bits of the variable resistance ladders of the resistance arrays 24P and 24R by resistance array controllers 27P and 27R, respectively, the amount of attenuation (the amount of increase) by the resistance arrays 24P and 24R is decided. Note that a step width of the amount of attenuation (the amount of increase) of the resistance arrays 24P and 24R is decided according the number of bits of the variable resistance ladders.

Note that the switches S5 and S6 are provided for audio mute. When a signal for performing a mute process is inputted in the attenuator operation mode (not shown in FIG. 1), the mode selector 23 causes the switches S5 and S6 to select the internal midpoint potential VCOMMON. An output of the speaker 4 is thereby audio-muted. In a case where audio mute is not specified, and in the ramp voltage generation mode, the mode selector 23 causes the switches S5 and S6 to select normal-phase and anti-phase signals from the resistance arrays 24P and 24R.

In the present embodiment, the starting voltage generating portion 22 sets such a value that is at a level at which the CDAs 3P and 3R are clipped, and that is lower as the power supply voltage PVdd is larger and is higher as the power supply voltage PVdd is smaller, as the starting voltage (an initial value). In other words, the starting voltage generating portion 22 generates a ramp voltage at a level at which the CDAs 3P and 3R are slightly clipped.

Note that, ideally, the starting voltage generating portion 22 only has to generate such a ramp voltage that the LC-LPF outputs become 0 V, as the starting voltage irrespective of fluctuation of the power supply voltage PVdd. However, since pop noise occurs if the LC-LPF outputs are higher than 0 V at startup, it is essential to cause the LC-LPF outputs to be clipped. In other words, the level of being slightly clipped refers to a voltage value at a level that is as high as possible and that certainly causes clipping.

Since the starting voltage generating portion 22 generates the voltage value at the level at which the CDAs 3P and 3R are slightly clipped, as the starting voltage, LC-LPF(LP, CP, LR, CR) outputs of the CDAs 3P and 3R begin to rise from 0 V in a relatively short time period after the ramp voltage begins to rise. Therefore, it is possible to shorten a startup tithe period required until the internal midpoint potential VCOMMON is reached, irrespective of fluctuation of the power supply voltage PVdd.

In the present embodiment, a rate of change in the amount of increase (a rate of increase) of the resistance arrays 24P and 24R to further shorten the startup time period. The resistance arrays 24P and 24R are controlled by the resistance array controllers 27P and 27R, respectively. The resistance array controllers 27P and 27R control the resistance arrays 24P and 24R, respectively, to decide the amount of attenuation of an inputted audio signal during the attenuator operation mode and decide a ramp voltage value during the ramp voltage generation mode.

When the rate of increase in the ramp voltage is increased, the startup time period is shortened, but the level of pop noise increases. On the contrary, when the rate of increase in the ramp voltage is decreased, the level of pop noise can be decreased, but the startup time period lengthens. However, the pop noise significantly occurs immediately after LC-LPF (LP, CP, LR, CR) outputs of the CDAs 3P and 3R change from 0 V, and, after that, the pop noise is relatively small even if there is imbalance between the CDAs 3P and 3R. Therefore, in the present embodiment, control is performed so that, after a predetermined time period after the outputs of the CDAs 3P and 3R are unclipped and outputs of LC-LPFs become higher than 0 V, the rate of increase in the ramp voltage becomes higher.

A clip detector 34P detects a clip period from outputs of the output drivers 33PU and 33PD and outputs a detection result to a timing controller 26P. A clip detector 34R detects a clip period from outputs of the output drivers 33RU and 33RD and outputs a detection result to a timing controller 26R. The timing controllers 26P and 26R output signals for increasing the amount of increase in the ramp voltages to the resistance array controllers 27P and 27R, respectively, after a predetermined time period after the ends of the clip periods.

The resistance array controllers 27P and 27R control the resistance arrays 24P and 24R, respectively, to cause the ramp voltages to gradually increase during the ramp voltage generation mode, and increase the amount of increase in the ramp voltages after the predetermined time period after the CDAs 3P and 3R are unclipped.

For example, in a case where the resistance arrays 24P and 24R are configured with variable resistance ladders, an amplification rate can be increased by shortening an interval of change in control signals given to respective control bits of the variable resistance ladders. Immediately after startup, the rate of increase in the ramp voltages is caused to be relatively low by causing the interval of change in the control signals to be relatively long during a predetermined period after clipping as a low amplification rate section (also referred to as a low speed section). After the predetermined period after clipping, the amplification rate in the ramp voltages is caused to be relatively high by causing the interval of change in the control signals to be relatively short, as a high amplification rate section (also referred to as a high speed section). Consequently, it is possible to further shorten the startup time period while suppressing pop noise.

Figure 2:
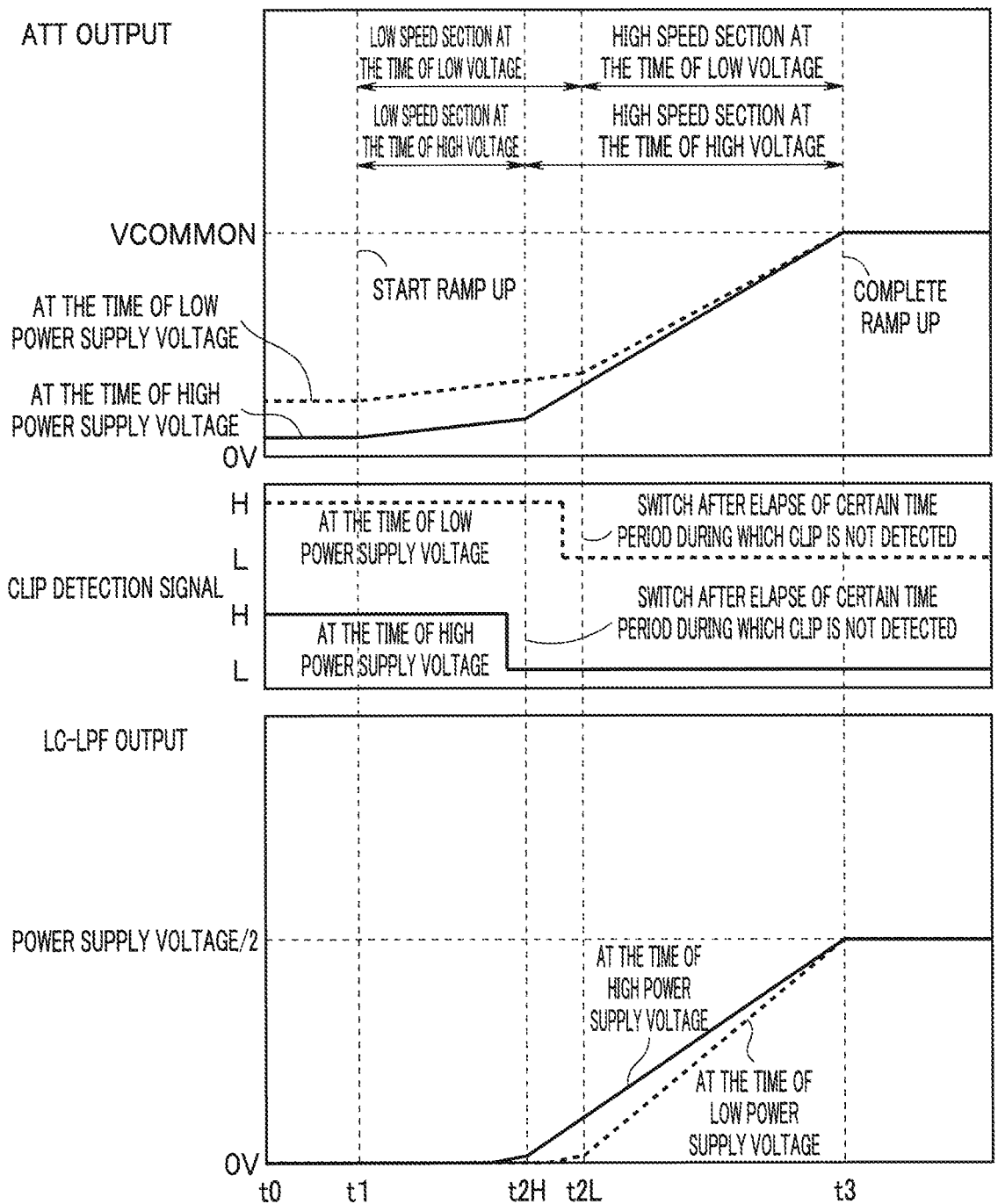
FIG. 2 is a waveform diagram in which a horizontal axis indicates time and a vertical axis indicates and an input/output level, and inputs of CDAs 3P and 3R and outputs of LC-LPFs (LP and CP, LR, CR) are shown on upper and lower parts, respectively.

Next, operation of the present embodiment will be described. FIG. 2 is a waveform diagram showing inputs of the CDAs 3P and 3R (ATT outputs), clip detection signals from the clip detectors 34P and 34R, and the LC-LPF outputs. A horizontal axis indicates time, and a vertical axis indicates an input/output level. (In case where power supply voltage PVdd is high)

It is assumed that a relatively high power supply voltage PVddH is applied to the power supply circuit 5 and the starting voltage generating portion 22 as the power supply voltage PVdd due to fluctuation of the output voltage of the battery. Even in this case, the power supply circuit 5 generates a constant internal power supply voltage AVdd, and the internal midpoint potential generating portion 21 generates a constant internal midpoint potential VCOMMON. Since the power supply voltage PVddH is a relatively high voltage, the starting voltage generating portion 22 generates a relatively low voltage VsL, as the starting voltage. The starting voltage VsL is set to the level at which the LC-LPF Outputs are slightly clipped. In FIG. 2, each waveform at the time of a high power supply voltage is shown by a solid line.

Immediately after startup, the mode selector 23 sets the ramp voltage generation mode and uses the resistance arrays 24P and 24R to generate ramp voltages. The mode selector 23 causes the internal midpoint potential generating portion 21 to be connected to one end of the resistance array 24P or 24R by the switch S1 or S3, and causes the starting voltage generating portion 22 to be connected to the other end of the resistance array 24P or 24R by the switch S2 or S4. In other words, the mode selector 23 causes the internal midpoint potential VCOMMON to be supplied to one end of the resistance array 24P or 24R, and causes the starting voltage VsL to be supplied to the other end of the resistance array 24P or 24R.

Immediately after startup, the resistance array controllers 27P and 27R perform control to cause the starting voltages VsL to be generated from the resistance arrays 24P and 24R. The voltages generated in the resistance arrays 24P and 24R are supplied to the input ends of the CDAs 3P and 3R via the buffer amplifiers 25P and 25R as output circuits, respectively.

At startup (t0), the starting voltages VsL are inputted to the CDAs 3P and 3R (see the upper part of FIG. 2). Since the starting voltages VsL are set to the level at which the LC-LPF outputs are clipped, the LC-LPF outputs remain 0 V (see the lower part of FIG. 2).

When a ramp-up start timing t1 is reached, the resistance array controllers 27P and 27R control the resistance arrays 24P and 24R to increase the starting voltages VsL, for example, by one step. Increased ramp voltages are outputted from the resistance arrays 24P and 24R.

After that, the resistance array controllers 27P and 27R sequentially cause the ramp voltages step by step in a predetermined cycle. Waveforms in low speed sections on the upper part of FIG. 2 show increase in the ramp voltages.

As the ramp voltages rise, the amplitude based on the internal midpoint potential VCOMMON gradually decreases. When the ramp voltages reach a redetermined level, the CDAs 3P and 3R get out of the clipped state, and the LC-LPF outputs rise. Note that when the CDAs 3P and 3R have gotten out of the clipped state, the clip detection signals switch from H to L. Since the rate of increase in the LC-LPF outputs in the low speed sections is relatively low, pop noise that occurs from the speaker 4 can be sufficiently suppressed.

The clip detectors 34P and 34R output clip detection results of the LC-LPF outputs to the timing controllers 26P and 26R, respectively. When the clip detection signals switch to L, the timing controllers 26P and 26R output signals for increasing the amount of increase in the ramp voltages to the resistance array controllers 27P and 27R, respectively, at a timing t2H after a predetermined period.

Consequently, the low speed section transitions to the high speed section. The resistance array controllers 27P and 27R control the resistance arrays 24P and 24R to shorten the cycle of increasing the ramp voltages by one step to sequentially increase the ramp voltages. As shown on the upper part of FIG. 2, the amount of increase in the ramp voltages per unit time period in the high speed section is larger in comparison with the low speed section. Therefore, the amount of increase in the LC-LPF outputs per unit time period also increases, and the output midpoint potential is reached in a relatively short time period (a timing t3).

Thus, in a case where the power supply voltage PVdd is a high voltage, it is possible to, by causing the rate of increase in the LC-LPF outputs in the high speed section to be relatively high while sufficiently suppressing pop noise by causing the rate of increase in the LC-LPF outputs in the low speed section to be relatively low, shorten a time period required until an output midpoint potential PVdd/2 is reached.

When the LC-LPF outputs reach the output midpoint potential, the mode selector 23 transitions from the ramp voltage generation mode to the attenuator operation mode. After connecting the switches S5 and S6 to the internal midpoint potential generating portion 21, the switches S1 and S3 are connected to the amplifier 1, and the switches S2 and S4 are connected to the internal midpoint potential generating portion 21. Note that a delay time period until the LC-LPF outputs change due to change in the output of the signal generation circuit 2 is extremely short. Therefore, the mode selector 23 may judge a timing when outputs of the resistance arrays 24P and 24R reach the internal midpoint potential VCOMMON as a timing when the LC-LPF outputs reach the output midpoint potential.

When the attenuator operation mode is entered, the resistance arrays 24P and 24R function as audio signal attenuators. By connecting the switches S5 and S6 to the resistance arrays 24P and 24R when mute is released, normal-phase and anti-phase signals attenuated based on the resistance arrays 24P and 24R on the basis of the internal midpoint potential VCOMMON are outputted from the resistance arrays 24P and 24R. Thus, the LC-LPF outputs become signals with an amplitude based on an inputted audio signal, around the output midpoint potential. The inputted audio signal is amplified based on the attenuator and the gains of the CDAs 3P and 3R, and a sound corresponding to the inputted sound is outputted from the speaker 4. (In case where power supply voltage PVdd is low)

Next, it is assumed that a relatively low power supply voltage PVddL is applied to the power supply circuit 5 and the starting voltage generating portion 22 as the power supply voltage PVdd due to fluctuations of the output voltage of the battery. The power supply circuit 5 generates a constant internal power supply voltage AVdd, and the internal midpoint potential generating portion 21 generates a constant internal midpoint potential VCOMMON. Since the power supply voltage PVddL is a relatively low voltage, the starting voltage generating portion 22 generates a relatively high voltage VsH as the starting voltage. Though the power supply voltage PVddH is relatively low, and the LC-LPF outputs are in a state of being relatively easily clipped, the starting voltage VsH is at the level at which the LC-LPF outputs are slightly clipped. In FIG. 2, each waveform at the time of a low power supply voltage is shown by a broken line.

Immediately after startup, the ramp voltages are the starting voltage VsH, and increase by a relatively small amount of increase in the low speed section (the upper part of FIG. 2).

Immediately after startup, the LC-LPF outputs are clipped and 0 V (the lower part of FIG. 2). As the ramp voltages increase, the LC-LPF outputs are unclipped, and the level begins to rise. Since the LC-LPF outputs increase by a relatively small amount of increase in the low speed section, pop noise that occurs immediately after the LC-LPF outputs are unclipped can be sufficiently suppressed.

When the LC-LPF outputs have gotten out of the clipped state, the clip detection signals change from H to L (the middle part of FIG. 2). The resistance array controllers 27P and 27R transition to the high speed section at a timing t2L after elapse of a predetermined period after the ends of the clip periods, and cause the ramp voltages to increase by a relatively large amount of increase. In the high speed section, the LC-LPF outputs increase by a relatively large amount of increase and reach the output midpoint potential in a relatively short time period (the timing t3).

Thus, it is possible to shorten the startup time period while suppressing occurrence of pop noise, irrespective of fluctuation of the power supply voltage PVdd.

Note that though the timing to transition to the high speed section is different at the time of high voltage and at the time of low voltage in the example of FIG. 2, it is also possible to cause transition to the high speed section at the same timing to be performed by individually controlling the transition timing at the time of high voltage and the transition timing at the time of low voltage.

Further, though an example of getting out of the clipped state faster at the time of a high power supply voltage than at the time of a low power supply voltage is shown in FIG. 2, there may be a case opposite to the above case depending on setting of the starting voltage.

Note that, in the present embodiment, the resistance arrays 24P and 24R are used as attenuators in the attenuator operation mode. It is possible to cause the output level of the amplifier 1 to decrease to the internal midpoint potential VCOMMON by controlling the resistance arrays 24P and 24R by the resistance array controllers 27P and 27R or cause outputs of the CDAs 3P and 3R to be muted by connecting the switches S5 and S6 to the internal midpoint potential generating portion 21. In this case, inputs to the CDAs 3P and 3R are the internal midpoint potential VCOMMON, and it does not happen that pop noise occurs at the time of returning to the normal operation from mute.

Figure 3:
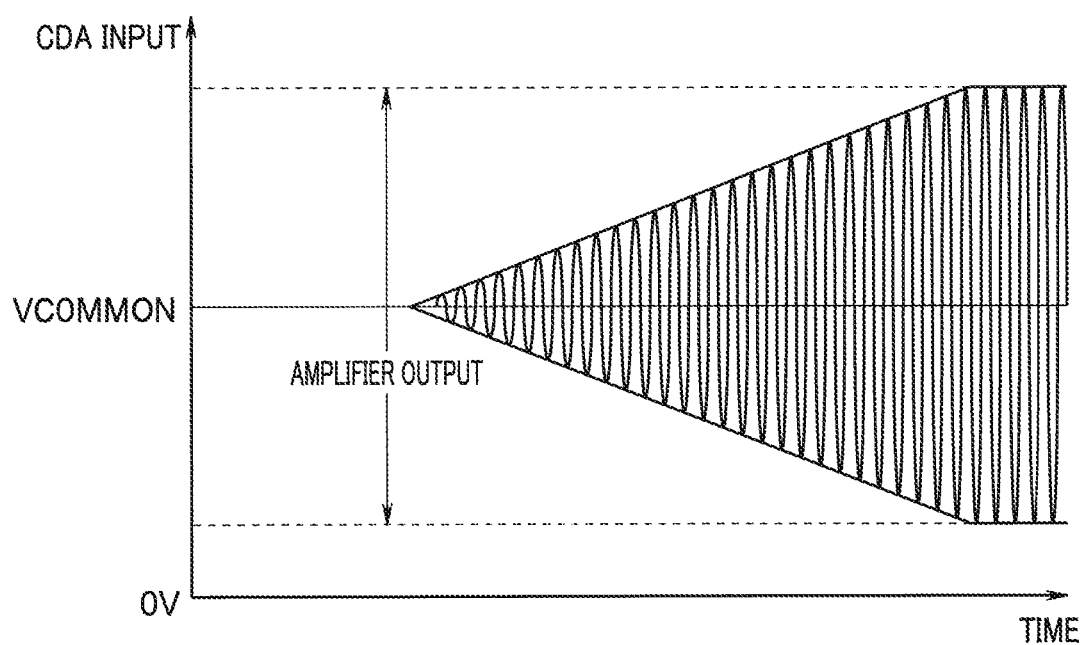
FIG. 3 is a waveform diagram showing inputs of the CDAs 3P and 3R at the time of transition from mute to normal operation.

FIG. 3 is a waveform diagram showing inputs of the CDAs 3P and 3R (CDA inputs) at the time of transition from mute to the normal operation. A horizontal axis indicates time, and a vertical axis indicates an input level of the CDAs 3P and 3R. The CDA inputs during mute are the internal midpoint potential VCOMMON, and it is possible to cause the CDA inputs to rise to the output level of the amplifier 1 by adjusting the resistance arrays 24P and 24R. Thus, it is possible to realize fade-in in which pop noise is reduced at the time of transition from the mute operation to the normal operation. Note that, even at the time of transition from the normal operation to mute, pop noise can be suppressed by controlling the resistance arrays 24P and 24R. Further, in transition from the time of outputting a sound to the time of mute, it becomes possible to suppress pop noise by realizing fade-out.

Thus, in the present embodiment, it is possible to, by changing the starting voltages of the ramp voltages according to fluctuation of the power supply voltage PVdd, cause the ramp voltages to be at the level at which the LC-LPF outputs are slightly clipped immediately after startup. Consequently, it is made possible for the LC-LPF outputs to be unclipped in a short time period immediately after startup, and it is made possible for the LC-LPF outputs to reach the output midpoint potential in a relatively short time period while the rise slopes of the ramp voltages are made gentle. Furthermore, by causing the rise slopes of the ramp voltages to be gentle during a predetermined period immediately after end of the clip periods during which pop noise is influential and increasing the rise slopes of the ramp voltages after the ends of the periods, it is enabled to shorten a time period until which the LC-LPF outputs reach the output midpoint potential. In other words, it is possible to further shorten the startup time period while suppressing pop noise.

Second Embodiment

Figure 4:
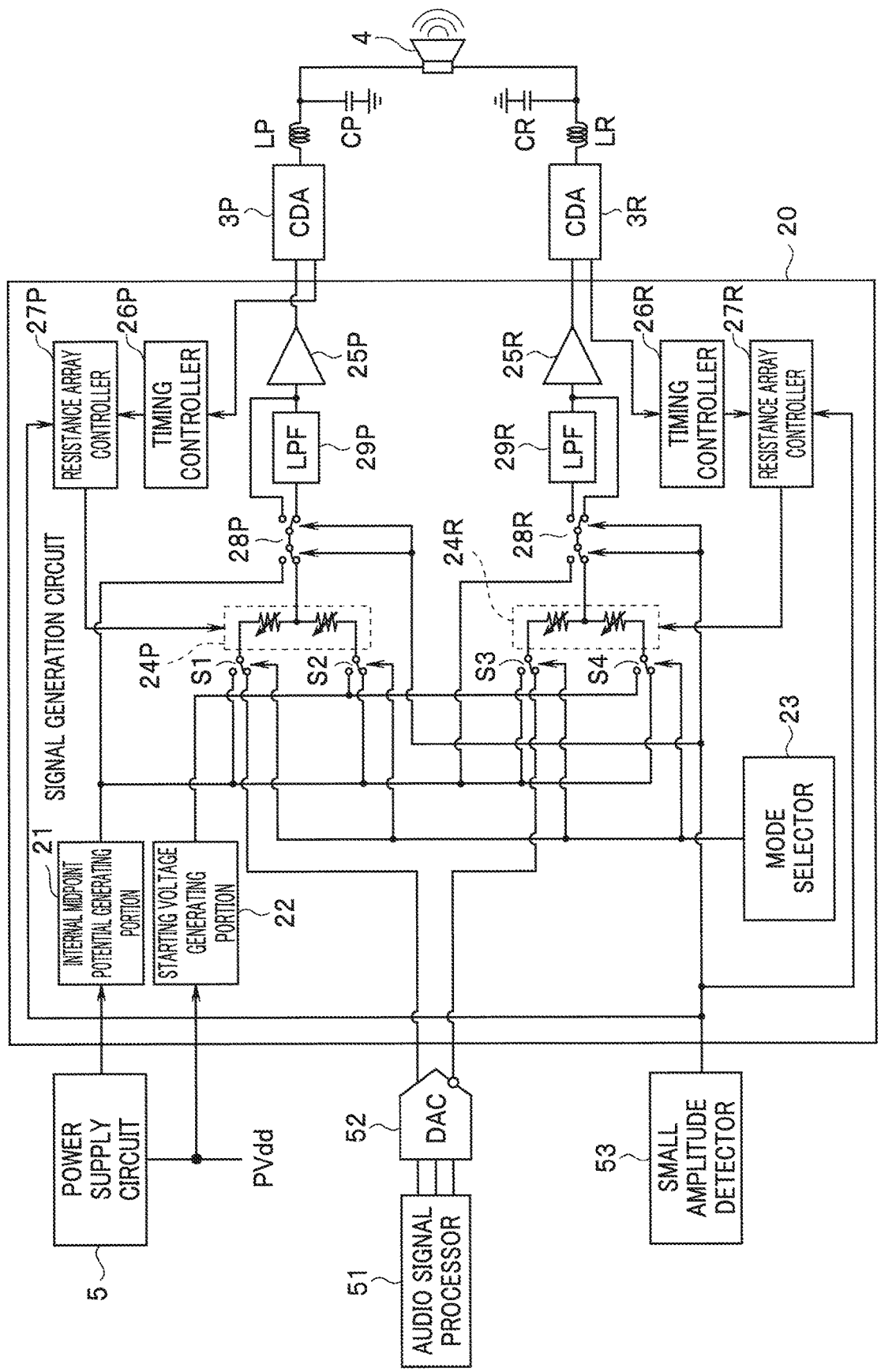
FIG. 4 is a circuit diagram showing a second embodiment of the present invention.

FIG. 4 is a circuit diagram showing a second embodiment of the present invention. In FIG. 4, the same components as components in FIG. 1 are given the same reference symbols, and description of the components will be omitted.

The present embodiment shows an example of adopting a digital/analog conversion circuit (hereinafter referred to as a DAC) configured to convert an inputted digital audio signal to an analog audio signal. A DAC 52 converts a digital signal from an audio signal processor 51 to normal-phase and anti-phase analog signals and outputs the analog signals to a signal generation circuit 20. The normal-phase analog signal is supplied to the switch S1, and the anti-phase analog signal is supplied to the switch S3.

The signal generation circuit 20 is different from the signal generation circuit 2 in FIG. 1 in adopting switches 28P and 28R instead of the switches S5 and S6 and adopting LPFs 29P and 29R. Further, in the present embodiment, a small amplitude detector 53 is provided. When detecting that the level of the inputted audio signal has become equal to or smaller than a predetermined minute amplitude, the small amplitude detector 53 outputs a signal to transition to mute. Being equal to or smaller than the predetermined minute amplitude refers to a level at which an outputted sound cannot be heard by human ears.

The switch 28P is controlled by the small amplitude detector 53 to output the internal midpoint potential VCOMMON from the internal midpoint potential generating portion 21 to the buffer amplifier 25P or output an output of the resistance array 24P to the LPF 29P. The switch 28R is controlled by the small amplitude detector 53 to output the internal midpoint potential VCOMMON from the internal midpoint potential generating portion 21 to the buffer amplifier 25R or output an output of the resistance array 24R to the LPF 29R.

Since the DAC 52 performs switching operation at the time of digital/analog conversion, the DAC 52 causes noise with a higher frequency than the audio band to occur. It is conceivable that the high frequency noise is mixed into the audio band by switching operation of the CDAs 3P and 3R. Therefore, the LPFs 29P and 29R remove high-frequency noise from outputs of the resistance arrays 24P and 24R to output the outputs to the buffer amplifiers 25P and 25R.

In the present embodiment, operation in the ramp voltage generation mode is similar to the operation in the first embodiment.

During the attenuator operation mode, the switches 28P and 28R output outputs of the resistance arrays 24P and 24R to the LPFs 29P and 29R, respectively. The outputs of the resistance arrays 24P and 24R are signals, the levels of which change according to an inputted audio signal, around the internal midpoint potential VCOMMON. The LPFs 29P and 29R output the signals to the CDAs 3P and 3R via the buffer amplifiers 25P and 25R, respectively, after removing high-frequency noise that occurs accompanying operation of the DAC 52. Thus, the LC-LPF outputs change with an amplitude corresponding to the inputted audio signal, around the output midpoint potential to drive the speaker 4, and a sound is outputted from the speaker 4.

Here, it is assumed that the level of the inputted audio signal becomes equal to or below the minute amplitude. In this case, it becomes difficult for the output of the speaker 4 to be heard by human ears. Thermal noise of the resistance arrays 24P and 24R and the LPFs 29P and 29R becomes dominant, and the noise is audio-outputted from the speaker 4. Therefore, in the present embodiment, the internal midpoint potential VCOMMON is supplied to the buffer amplifiers 25P and 25R through a route that does not pass through either the resistance arrays 24P and 24R or the LPFs 29P and 29R during mute. When detecting that the amplitude of the inputted audio signal is equal to or smaller than the minute amplitude, the small amplitude detector 53 outputs a signal to transition to mute. By the mute signal, the switches 28P and 28R select the internal midpoint potential VCOMMON and output the internal midpoint potential VCOMMON to the buffer amplifiers 25P and 25R, respectively. The internal midpoint potential VCOMMON is supplied to the CDAs 3P and 3R, and the audio output of the speaker 4 enters a mute state. Consequently, occurrence of the thermal noise is suppressed. At the time of returning from mute to the normal operation, operation similar to the operation in FIG. 3 is performed, and fade-in operation becomes possible in a short time period while pop noise is suppressed.

Note that the small amplitude detector 53 may be adapted to, when continuously detecting a level below the minute amplitude for a predetermined period, generate a mute signal. Further, the small amplitude detector 53 may be adapted to, at the time of transition from the normal operation to mute, gradually increase the amount of attenuation by the resistance arrays 24P and 24R and, in the end, switch to the internal midpoint potential VCOMMON to perform mute.

Thus, in the present embodiment, advantageous effects similar to the advantageous effect of the first embodiment can also be obtained. Further, when a digital audio signal is inputted, noise can be removed from an output of a DAC by LPFs, and it is possible to supply the internal midpoint potential VCOMMON to CDAs via a route not passing through resistance arrays and the LPFs during mute, so that noise characteristics can be improved.

Though an example in which a Class-D amplifier is configured with a differential circuit is shown in each of the above embodiments, a single-ended type can be similarly configured.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A signal generation circuit giving a generated signal corresponding to an input signal to an amplification circuit configured to generate an output within a range based on a power supply voltage, the signal generation circuit comprising:
    a first voltage generating portion configured to generate an internal midpoint potential based on the power supply voltage;
    a second voltage generating portion configured to generate a starting voltage of the generated signal based on the power supply voltage and gain of the amplification circuit;
    a resistance circuit configured with a variable resistance element and configured to, when the input signal and the internal midpoint potential, or the internal midpoint potential and the starting voltage are inputted, output a voltage caused to attenuate or pass through on the basis of the internal midpoint potential;
    a controlling portion configured to output a control signal to change a resistance value of the resistance circuit; and
    an output circuit configured to output the output voltage of the resistance circuit as the generated signal.

2. The signal generation circuit according to claim 1, wherein the controlling portion causes the output voltage to change in stages.

3. The signal generation circuit according to claim 1, wherein the controlling portion outputs the control signal that increases an increase rate of the output voltage, after a predetermined time period after the output of the amplification circuit reaches a predetermined level.

4. The signal generation circuit according to claim 1, wherein the controlling portion outputs the control signal that increases an increase rate of the output voltage, after a predetermined time period after it is detected that the output of the amplification circuit is unclipped.

5. The signal generation circuit according to claim 4, wherein the controlling portion, judges whether the output of the amplification circuit is unclipped or not, by an output of a clip detection circuit configured in the amplification circuit.

6. The signal generation circuit according to claim 1, further comprising a mode selector configured to cause the resistance circuit to operate in a ramp voltage generation mode that causes the output voltage to increase, at startup, and operate in an attenuator operation mode that causes the output voltage to attenuate, after the output voltage reaches the internal midpoint potential.

7. The signal generation circuit according to claim 6, wherein the mode selector gives the starting voltage and the internal midpoint potential to the resistance circuit to cause a ramp voltage to be generated from the resistance circuit, in the ramp voltage generation mode; and, after the ramp voltage reaches the internal midpoint potential, the mode selector transitions to the attenuator operation mode and gives the input signal to the resistance circuit to cause the resistance circuit to operate as an attenuator.

8. The signal generation circuit according to claim 1, wherein
the resistance circuit is configured with a resistance array, and
the signal generation circuit further comprises a switch circuit configured to be controlled by the controlling portion to selectively give the input signal or the internal midpoint potential to one end of the resistance array and selectively give the starting voltage or the internal midpoint potential to another end of the resistance array.

9. The signal generation circuit according to claim 1, further comprising:
a digital/analog conversion circuit configured to convert an inputted digital signal to an analog signal and output the analog signal;
a low-pass filter configured to remove a noise component from the output voltage of the resistance circuit to output the output voltage to an amplification circuit; and
a route switching portion configured to, in a case of muting an output of the amplification circuit, supply the internal midpoint potential to the amplification circuit instead of the output of the low-pass filter.

10. The signal generation circuit according to claim 9, further comprising a minute amplitude detector configured to, when detecting that the analog signal has an amplitude smaller than a predetermined amplitude, supply the internal midpoint potential to the amplification circuit to mute the output of the amplification circuit.

11. The signal generation circuit according to claim 1, wherein the amplification circuit is a Class-D amplifier.

12. The signal generation circuit according to claim 1, wherein the input signal is an audio signal.

13. A signal generation circuit comprising:
a first voltage generating portion configured to generate an internal midpoint potential based on a power supply voltage;
a digital/analog conversion circuit configured to convert an inputted digital signal to an analog signal and output the analog signal;
a resistance circuit configured with a variable resistance element and configured to output a voltage caused to attenuate or pass through on the basis of the internal midpoint potential, based on the analog signal;
a low-pass filter configured to remove a noise component from the output voltage of the resistance circuit to output the output voltage to an amplification circuit; and
a route switching portion configured to, in a case of muting an output of the amplification circuit, supply the internal midpoint potential to the amplification circuit instead of the output of the low-pass filter.

14. The signal generation circuit according to claim 13, further comprising a minute amplitude detector configured to, when detecting that the analog signal has an amplitude smaller than a predetermined amplitude, supply the internal midpoint potential to the amplification circuit to mute the output of the amplification circuit.

15. A signal generation circuit giving a generated signal corresponding to an input signal to an amplification circuit configured to generate an output within a range based on a power supply voltage, the signal generation circuit comprising:
a first voltage generating portion configured to generate an internal midpoint potential based on the power supply voltage;
a second voltage generating portion configured to generate a starting voltage of the generated signal based on the power supply voltage and gain of the amplification circuit;
a resistance circuit configured with a variable resistance element and configured so that the inputted signal and the internal midpoint potential, or the internal midpoint potential and the starting voltage are inputted;
a controlling portion configured to output a control signal to change a resistance value of the resistance circuit; and
an output circuit configured to output the output voltage of the resistance circuit as the generated signal.

16. The signal generation circuit according to claim 15, wherein the controlling portion causes the output voltage to change in stages.

17. The signal generation circuit according to claim 15, wherein the controlling portion outputs the control signal that increases an increase rate of the output voltage, after a predetermined time period after the output of the amplification circuit reaches a predetermined level.

18. The signal generation circuit according to claim 15, wherein the controlling portion outputs the control signal that increases an increase rate of the output voltage, after a predetermined time period after it is detected that the output of the amplification circuit is unclipped.

19. The signal generation circuit according to claim 15, further comprising a mode selector configured to cause the resistance circuit to operate in a ramp voltage generation mode that causes the output voltage to increase, at startup, and operate in an attenuator operation mode that causes the output voltage to attenuate, after the output voltage reaches the internal midpoint potential.

20. The signal generation circuit according to claim 15, wherein
the resistance circuit is configured with a resistance array, and
the signal generation circuit further comprises a switch circuit configured to be controlled by the controlling portion to selectively give the input signal or the internal midpoint potential to one end of the resistance array and selectively give the starting voltage or the internal midpoint potential to another end of the resistance array.

* * * * *